(12) United States Patent
Cotte et al.

(10) Patent No.: US 6,258,703 B1
(45) Date of Patent: Jul. 10, 2001

(54) REFLOW OF LOW MELT SOLDER TIP C4'S

(75) Inventors: John Michael Cotte, New Fairfield, CT (US); Madhav Datta, Hillsboro, OR (US); Sung Kwon Kang, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/359,061

(22) Filed: Jul. 21, 1999

(51) Int. Cl.[7] .................................................. H01L 21/44
(52) U.S. Cl. ........................................... 438/612; 257/772
(58) Field of Search .................................... 257/772, 736, 257/737, 738; 438/612, 613, 614, 695

(56) References Cited

U.S. PATENT DOCUMENTS

| | | | |
|---|---|---|---|
| 5,130,779 | * 7/1992 | Agarwala et al. | 257/772 |
| 5,462,638 | 10/1995 | Datta et al. | 156/656.1 |
| 5,486,282 | 1/1996 | Datta et al. | 205/123 |
| 5,800,726 | 9/1998 | Cotte et al. | 216/108 |
| 5,808,853 | * 9/1998 | Dalal et al. | 361/306.1 |
| 5,956,606 | * 9/1999 | Burnette | 438/615 |
| 6,060,373 | * 5/2000 | Saitoh | 438/459 |
| 6,083,773 | * 7/2000 | Lake | 438/108 |

* cited by examiner

*Primary Examiner*—Don Wong
*Assistant Examiner*—Trinh Vo Dinh
(74) *Attorney, Agent, or Firm*—Robert M. Trepp

(57) ABSTRACT

An array of C4 solder bumps and a method for making is described incorporating an array of conductive areas on an electrical device, each conductive area having a layer of ball limited metalurgy at the device surface and two layers of solder having respective melting temperatures to form the C4 structure. The method includes melting the second layer of solder in the down position or towards earth to form a C4 solder ball or bump. The invention overcomes the problem of low temperature solder from wicking over the sidewall surfaces of the high melt solder of the C4 structure and attacking the edges of the underlying seed layers of the ball limited metalurgy.

4 Claims, 4 Drawing Sheets

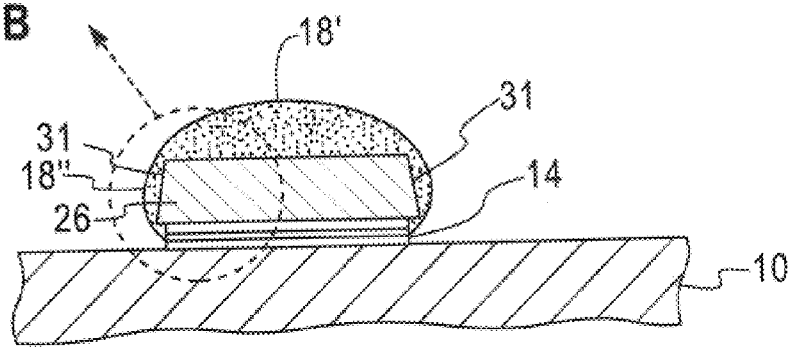
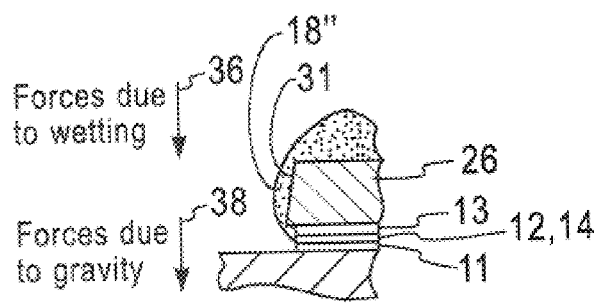
Fig. 3B
Fig. 3A
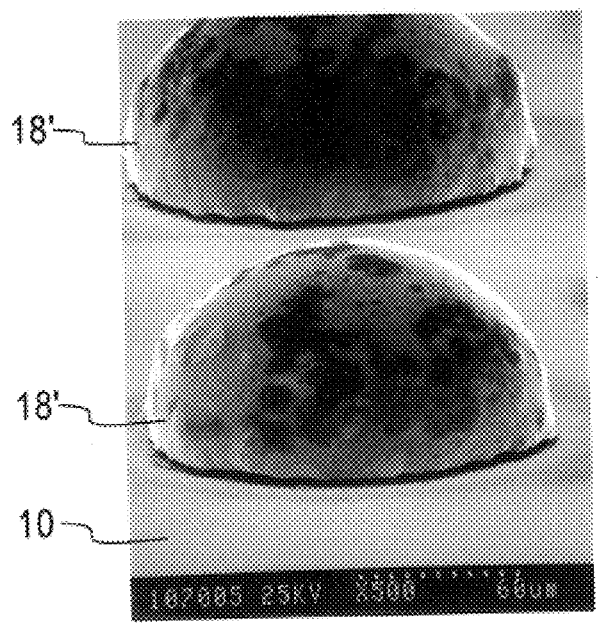
Fig. 3C

REFLOW OF LOW MELT SOLDER TIP C4'S

FIELD OF THE INVENTION

The present invention relates to the reflow of low temperature solder interconnects, especially in microelectronics fabrication.

BACKGROUND OF THE INVENTION

Controlled Collapse Chip Connection (C4) is an advanced interconnect technology for microelectronic chip packaging. C4 is also known as "flip chip," "solder bump" and "solder balls."

The basic idea of C4 is to connect chips, chip packages or other such units by means of solder bumps partially collapsed between the surfaces of two units. Each unit has a pad pattern which corresponds to a mirror image pattern of the other. The bumps of electrically conductive solder bridge the gap between respective pairs of metal pads on the units being connected. As the units are brought together, the solder bumps on the pads of the first unit are pressed against the corresponding conductive pads on the second unit, resulting in the partial collapse of the solder bump and formation of an interconnect between respective pads. This allows for the simultaneous formation of all interconnects between the units in a single step, in spite of slight variations in the surfaces of the units being joined.

In C4, the solder bumps are formed directly on the metal pads of one unit. The pads are electrically isolated from each other and other components by the insulating substrate that surrounds each pad. The substrate may be un-doped silicon or some other material. The bottom of each pad is in contact with a via, forming electrical continuity with the chip circuitry.

A major application of C4 is in joining semiconductor integrated circuit chips to chip packages. Integrated circuits are fabricated from semiconductor wafers in an array of repeat patterns, then diced into individual chips in order to minimize the processing cost per chip. Once separated into individual units, the chips are then assembled into packages large enough to handle. C4 bumps are placed on the chips prior to dicing, incorporating the benefits of wafer scale processing.

Chip sizes are continually shrinking, while circuit densities and I/O counts continue to increase, in order to enhance performance and reduce costs. These trends place higher demands on interconnects, making traditional bonding methods such as wire bonding and tape automated bonding (TAB) very difficult. C4 allows for very high density I/O with area array distribution as compared to peripheral contacts in TAB and wire bonding.

C4 solder bumps serve two functions; first, they act as electrical interconnects and second, they act to form a physical bond between the semiconductor chip and package. This demands a very precise placement of each C4 as well as uniform control of solder volumes.

One method of forming solder bumps is by vacuum deposition. A specially made mask with high precision vias is placed over the wafer for locating the solder bumps. The entire assembly is then placed into a vacuum chamber where solder is evaporated through the mask to form solder bumps on the wafer. This deposition process is non-selective, thereby solder deposits throughout the chamber as well as on the mask. During deposition, the wafer and mask are heated, therefore careful selection of mask material to match the coefficient of thermal (CTE) expansion of the wafer is needed. However, for this reason, the evaporation technique has limited extendibility to larger wafers.

An alternative technique for making solder bumps is electrodeposition, also called electrochemical plating or electroplating. This method also uses a mask to form solder bumps only at selected sites, but is vastly different than the evaporation technique.

Electrodeposition of solder bumps requires a continuous electrically conductive "seed layer" 14 adhered to the insulating substrate. The seed layer 14 function is to carry current necessary for electroplating the solder. FIG. 1A, labeled "prior art," shows a wafer substrate 10 whose surface is overlaid with a conductive layer 11 of either chromium (Cr) or a titanium tungsten alloy (Ti—W). Metal layer 11 will function as part of the seed layer for electrodepositing solder bumps. On top of layer 11 is deposited a thin "phased" layer 12 of 50% chromium and 50% copper (Cr—Cu). Finally, a third layer 13 of pure copper is deposited over the entire wafer surface. The Cr or Ti—W, Cr—Cu and Cu layers are of comparable thickness. Once seed layer 14 is deposited, the wafer is coated with photoresist, patterned and then exposed. The unexposed regions can then be developed or dissolved away to leave behind the cured photoresist as a mask 16 shown in FIG. 1A. Photoresist mask 16 forms the desired pattern of holes or vias across the wafer.

The next step is the electrodeposition of solder into the vias of the mask 16. All vias are filled simultaneously with the desired volume of solder during the deposition process. An electroplated solder bump 18 is shown in FIG. 1A. Once the solder bumps 18 are formed, photoresist mask 16 is removed leaving behind the solder bumps 18 and the continuous seed layer 14.

In order to electrically isolate solder bumps 18, it is necessary to remove the seed layer 14 between solder bumps 18. This is accomplished by etching away layers 11–13 with chemical or electrolytic action, in either case the solder bump 18 protects the layers 11–13 under it. FIG. 1B shows the seed layers 11–13 removed to leave the solder bumps electrically isolated but mechanically fixed to substrate 10. U.S. Pat. No. 5,486,282 (which is incorporated herein by reference) discloses an invention related to the selective removal of Cu and phased Cr—Cu by electroetching. U.S. Pat. Nos. 5,462,638 and 5,800,726 (which are incorporated herein by reference) disclose inventions related to the removal of a Ti—W alloy layer by chemical etching. FIG. 1C shows solder ball 18', formed by melting or reflowing the solder bump 18 of FIGS. 1A–1B. At this stage the solder ball is ready for joining.

Solder alloys used in C4 interconnects generally consist of lead (Pb) and tin (Sn). One characteristic used to select the solder alloy is the melting temperature. Conventionally chips were joined to multi-layer ceramic (MLC) substrates which could withstand temperatures greater than 350° C. However, there is a growing need to attach chips to organic packages, as well as direct chip attach (DCA) to organic boards such as FR4 boards, which can generally only withstand temperatures less than 300° C. A Pb—Sn alloy used for the high temperature application may contain 97% Pb and 3% Sn by weight which melts at 353° C., and for the low temperature application may contain 37% Pb and 63% Sn by weight (eutectic PbSn) which melts at 183° C.

During the reflow of solder bump 18 to form solder ball 18', Sn present in the solder reacts with the upper most Cu region of the third layer 13 of Cu, to form an intermetallic $(Cu_x, Sn_y,)$ where x is 6 and y is 5 or where x is 3 and y is 1. This intermetallic layer forms a strong bond between the solder ball 18' and the third layer 13 of Cu. In the high temperature application, with minimal Sn present (3 Wt. %), the degree of intermetallic formation is self limiting. However, in the low temperature application, with eutectic PbSn solder (63 Wt. % Sn), the excessive amount of Sn can react with and consume the underlying third layer 13 of Cu, degrading the solder-seed layer interface.

One method of forming a low temperature C4 structure is by capping a high temperature C4 bump with low temperature eutectic Pb—Sn solder, such as described in U.S. Ser. No. 08/710,992 filed Sep. 25, 1996 by Berger et al. entitled "Method for Making Interconnect for Low Temperature Chip Attachment" now U.S. Pat. No. 6,127,735 which issued Oct. 3, 2000 and assigned to assignee herein which is incorporated herein by reference. However, this method does not address the issue of low temperature solder wicking down around the high temperature C4 structure and attacking seed layer 14 from the side or exposed edge.

SUMMARY OF THE INVENTION

Accordingly, the present invention relates to a process of forming a low temperature tip C4 ball with minimal attack on the edges of the underlying seed layer by reaction with Sn from the low melting solder tip. In particular, the invention provides a method of reflowing a low temperature eutectic tip C4 structure with minimal wicking of the molten low melt solder down the side wall of the high melt solder of the C4 during intermediate reflow prior to assembly. A low melting solder tip C4 bump, reflowed with the molten tip facing down in the direction of the earth's gravitational field or force, has been shown to have significantly less wicking of the molten solder up the side wall of the high melt C4 structure. The reduced wicking prevents the attack on the edges of the underlying seed layers by inhibiting the interaction of Sn along the side of the C4 structure.

BRIEF DESCRIPTION OF THE DRAWINGS

FIG. 3A is an enlarged, cross-section view of an electrochemically fabricated C4 ball, reflowed with molten tip facing up with respect to earth during reflow.

FIG. 3B is an enlarged view of a portion of FIG. 3A.

FIG. 3C is an SEM micro graph of electrochemically fabricated C4 ball, reflowed with low melt solder tip facing up with respect to earth during reflow.

DETAILED DESCRIPTION OF THE PREFERRED EMBODIMENT

Figure 1A:
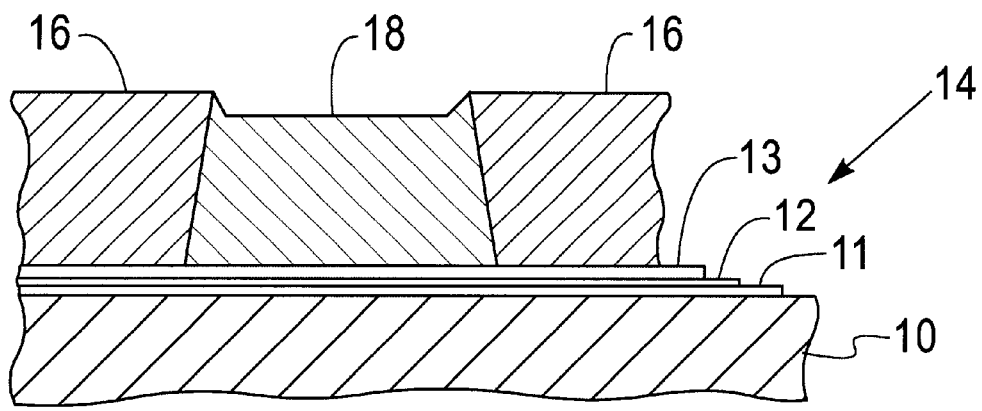
FIGS. 1A–1C are enlarged, cross-sectional views of C4 solder ball formation by electroplating in accordance with the prior art.
Figure 1B:
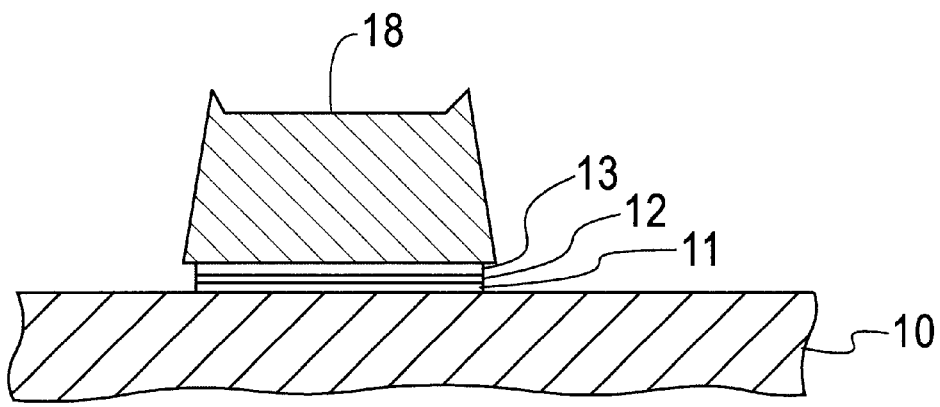
Figure 1C:
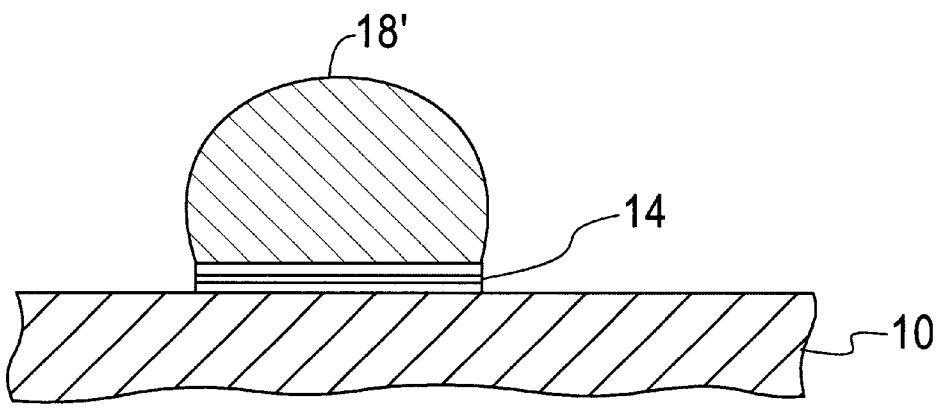
Figure 2A:
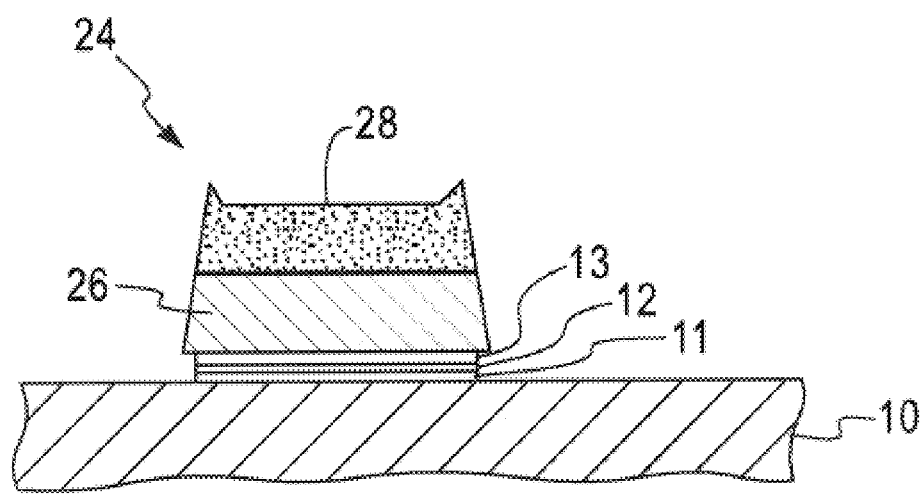
FIG. 2A is an enlarged, cross-sectional view of an electrochemically fabricated C4 bump made up of about half high melt and half low melt solder.
Figure 2B:
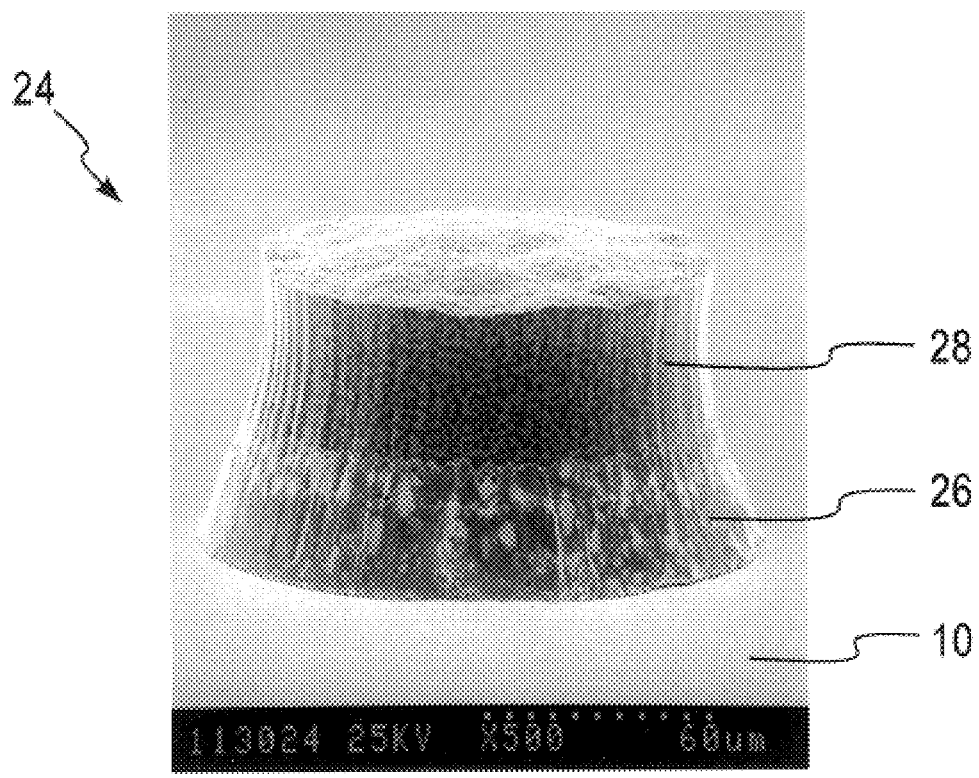
FIG. 2B is a Scanning Electron Microscope (SEM) micro graph of an electrochemically fabricated C4 bump made up of about half high melt and half low melt solder.

The present invention relates to a method of forming a low temperature tip C4 ball, with minimal degradation of the solder-seed layer interface during the preliminary reflow. More specifically, the method was developed to reflow a dual solder alloy C4 bump 24 shown in FIGS. 2A–2B, where the lower portion 26 of solder bump 24 is made of a high melt solder for example 97% Pb and 3% Sn by Wt., and the upper portion 28 is made of a low melt solder for example eutectic Pb—Sn, 37% Pb and 63% Sn by Wt. This dual alloy C4 bump 24 may be electrochemically fabricated by the process described in the related art, with the modification of plating a dual layer solder structure as opposed to a single alloy structure.

In order to form a uniform array of C4 solder balls, solder bumps 24 are reflowed. In the reflow of a dual solder, low melt tip C4 bump 24, the temperature is raised above the melting temperature of the low melt solder (>183° C. for eutectic Pb—Sn). The high melt solder base 26 remains intact while the low melt tip 18' transforms to the liquid state as shown in FIG. 3A.

For a liquid such as molten solder in contact with a solid, the equilibrium shape of the liquid is defined by the minimal total interfacial energy for all phase boundaries present. In the case of molten low melt PbSn solder 18' in contact with solid high melt PbSn solder 26, the stable configuration or lowest energy state results in the spreading of the liquid solder 18" over the surface of the solid (also known as wetting). The combination of the forces due to wetting on liquid solder 18" on sidewall 31 is shown by arrow 36 in FIG. 3B and the force due to gravity or acceleration, linear or centrifugal on liquid solder 18" at sidewall 31 is shown by arrow 38 in FIG. 3B. The forces on liquid solder 18" shown by arrows 36 and 38 results in the encapsulation of the high melt standoff structure 26 by the molten low melt solder 18", as shown in FIGS. 3A–3C. As the low melt solder 18" wets sidewall 31 of high melt base 26, it wicks down the sidewall 31 and comes into contact with the edges of underlying seed layers 11–13. In the case of eutectic Pb—Sn tip C4s, the Sn present reacts with the underlying Cu, to form excessive $Cu_xSn_y$ intermetallics where x is equal to 6 and y is equal to 5 and degrades the edge of solder-seed layers 11–13 of interface 14.

Figure 4A:
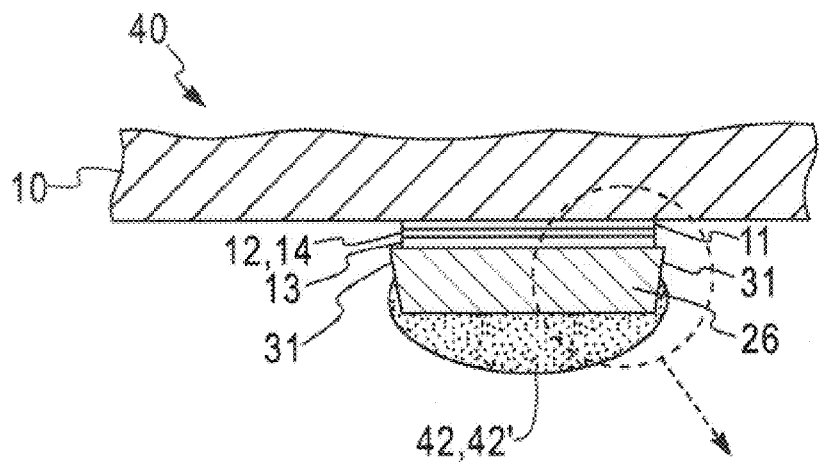
FIG. 4A is an enlarged, cross-section view of an electrochemically fabricated C4 ball, reflowed with the low melt solder tip facing down with respect to earth during reflow.
Figure 4B:
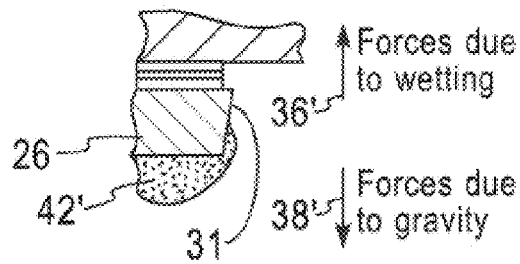
FIG. 4B is an enlarged view of a portion of FIG. 4A showing the forces on molten solder of a solder bump.
Figure 4C:
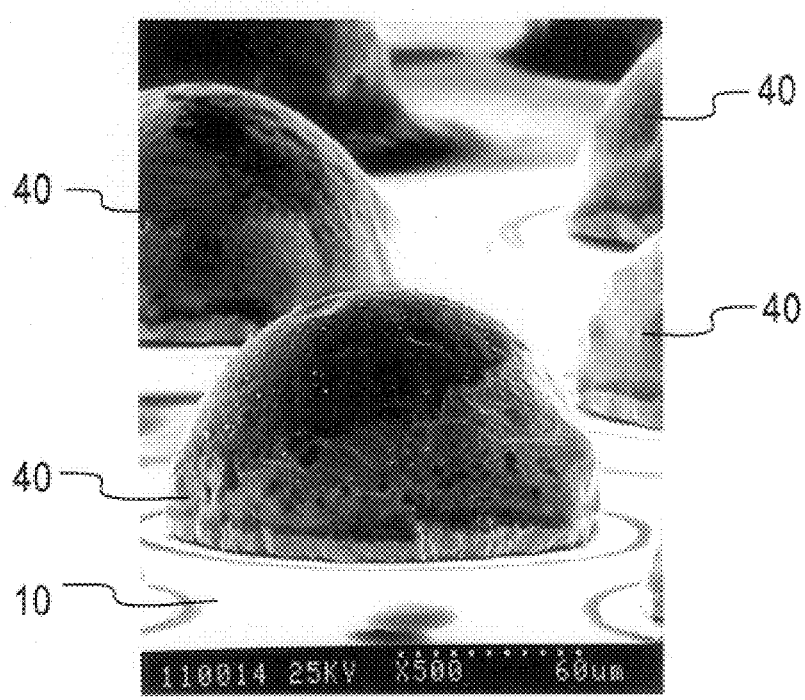
FIG. 4C is an SEM micro graph of an electrochemically fabricated C4 ball, reflowed with molten tip facing down with respect to earth during reflow.

The present invention addresses the issue of the molten solder wicking in a dual alloy C4 bump during preliminary reflow. By reflowing the dual layer C4 structure 40 with the low melt solder tip 42 facing down with respect to earth as shown in FIG. 4A, the wetting forces shown by arrow 36' in FIG. 4B act to cause the molten solder 42' to wet and wick along the sidewall 31 of C4 structure 40. The wetting forces shown by arrow 36' are offset by the force of gravity or by acceleration as shown by arrow 38' in FIG. 4B. By controlling the volume of the molten solder 42', the weight of the molten droplet can be used to prevent the wicking along the sidewall 31 of high melt solder base 26 of C4 structure 40. This method of reflowing a dual alloy C4 solder bump, with the low melt tip facing down with respect to earth in the direction of the gravitational force, prevents the contact of the high Sn containing molten solder 42' with the seed layers 11–13, as shown in FIGS. 4A–4C. The combination of gravity in one direction and the wetting force or surface tension in the opposite direction prevent the molten low melt solder 42' from flowing up the high melt solder standoff 26 and sidewall 31.

In FIGS. 1A through 4C of the drawing, like references are used for elements or components corresponding to elements or components of an earlier figure.

The reflow method of this invention is also applicable to structures other than dual alloy C4 solder structures 40, for instance, stud or column solder structures.

While there has been described and illustrated a method for reflow of low temperature solder tip C4's having a high melt solder standoff or base, it will be apparent to those skilled in the art that modifications and variations are possible without deviating from the broad scope of the invention which shall be limited solely by the scope of the claims appended hereto.

Having thus described our invention, what we claim as new and desire to secure as Letters Patent is:

1. A method for forming an array of C4 bumps on a first substrate of an electrical device comprising the steps of:

forming an array of conductive areas on said first substrate, each conductive area including a ball limited metallurgy to provide adhesion to said first substrate and a diffusion barrier, forming a first layer of solder having a first melting temperature on said conductive areas, respectively, said first layer having a sidewall corresponding substantially to a perimeter of said conductive areas, respectively, forming a second layer of solder having a second melting temperature lower than said first melting temperature on said first layer of solder, applying a first force on said first and second layer of solder away from said ball limited metallurgy, and heating said second layer of solder above said second melting temperature to cause a molten second layer to flow into a shape determined by said first force and a second force generated by said molten second layer of solder to wick to said sidewall of said first layer of solder, said first force adjusted to prevent said melted second layer from wicking over exposed sidewall surfaces of said ball limited metallurgy.

2. A reflow method for an array of C4 bumps on a first substrate wherein said C4 bumps includes a first layer of solder having a first melting temperature directly on a second layer of solder having a sidewall and a second melting temperature greater than said first melting temperature on said first substrate comprising the steps of:

positioning said array of C4 bumps wherein said first layer of solder is facing down with respect to said second layer of solder, and reflowing said first layer of solder whereby wicking on said sidewalls of said second layer by a molten first layer is against the force of gravity.

3. The reflow method according to claim 2, further including the step of heating said C4 bumps to a temperature 20–40 degrees C. higher than said first melting temperature but below said second melting temperature of said second layer of solder.

4. The reflow method according to claim 3 wherein said step of reflowing, includes the step of cooling said C4 bumps to a temperature below said first melting temperature while maintaining the orientation of said first solder layer facing down.

* * * * *